(12) United States Patent
Krishnamurthy et al.

(10) Patent No.: US 10,366,935 B2
(45) Date of Patent: Jul. 30, 2019

(54) ARCHITECTURE OF DRIVE UNIT EMPLOYING GALLIUM NITRIDE SWITCHES

(71) Applicant: OTIS ELEVATOR COMPANY, Farmington, CT (US)

(72) Inventors: Shashank Krishnamurthy, Rocky Hill, CT (US); Xin Wu, Glastonbury, CT (US); William A. Veronesi, Hartford, CT (US); Kyle W. Rogers, Stamford, CT (US); Daryl J. Marvin, Farmington, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 867 days.

(21) Appl. No.: 14/782,377

(22) PCT Filed: Apr. 9, 2013

(86) PCT No.: PCT/US2013/035743
§ 371 (c)(1),
(2) Date: Oct. 5, 2015

(87) PCT Pub. No.: WO2014/168607
PCT Pub. Date: Oct. 16, 2014

(65) Prior Publication Data
US 2016/0043616 A1   Feb. 11, 2016

(51) Int. Cl.
*H01L 23/495*   (2006.01)
*H01L 23/552*   (2006.01)
(Continued)

(52) U.S. Cl.
CPC ........ *H01L 23/3675* (2013.01); *H01L 25/072* (2013.01); *H01L 29/2003* (2013.01);
(Continued)

(58) Field of Classification Search
CPC ....... H01L 23/495; H01L 23/552; G05F 1/10; G05F 1/70; H01H 47/00; H03K 17/16; H03K 17/693
(Continued)

(56) References Cited

U.S. PATENT DOCUMENTS 7,999,365 B2 * 8/2011 Hu ..................... H01L 24/41
257/155
2007/0018210 A1 * 1/2007 Sheppard ............ H01L 29/7787
257/289

(Continued)

FOREIGN PATENT DOCUMENTS

DE   102008009955 A1   6/2009
EP      2273862 A1      1/2011
(Continued)

OTHER PUBLICATIONS

International Search Report for application PCT/US2013/035743, dated Jan. 14, 2014, 5 pages.
(Continued)

*Primary Examiner* — Xiaoliang Chen
(74) *Attorney, Agent, or Firm* — Cantor Colburn LLP

(57) ABSTRACT

A drive unit for a motor includes a printed circuit board (PCB); a first gallium nitride switch having a gate, the first gallium nitride switch mounted to the PCB; a second gallium nitride switch having a gate, the second gallium nitride switch mounted to the PCB; a gate driver generating a turn-off drive signal to turn off the first gallium nitride switch and turn off the second gallium nitride switch; a first turn-off trace on the PCB, the first turn-off trace directing the turn-off drive signal to the gate of the first gallium nitride switch; and a second turn-off trace on the PCB, the second turn-off trace directing the turn-off drive signal to the gate of the second gallium nitride switch; wherein an impedance of
(Continued)

the first turn-off trace is substantially equal to an impedance of the second turn-off trace.

12 Claims, 7 Drawing Sheets

(51) Int. Cl.
    *H05K 1/16*     (2006.01)
    *H01L 23/367*     (2006.01)
    *H02M 7/00*     (2006.01)
    *H01L 25/07*     (2006.01)
    *H01L 29/20*     (2006.01)
    *H02K 9/22*     (2006.01)
    *H05K 1/02*     (2006.01)
    *H05K 1/11*     (2006.01)
    *H05K 1/18*     (2006.01)
    *H03K 17/0412*     (2006.01)
    *H02K 11/33*     (2016.01)

(52) U.S. Cl.
    CPC ............... *H02K 9/22* (2013.01); *H02K 11/33* (2016.01); *H02M 7/003* (2013.01); *H03K 17/04123* (2013.01); *H05K 1/025* (2013.01); *H05K 1/0206* (2013.01); *H05K 1/0251* (2013.01); *H05K 1/112* (2013.01); *H05K 1/115* (2013.01); *H05K 1/18* (2013.01); *H01L 2924/0002* (2013.01); *H03K 2217/0036* (2013.01); *H05K 2201/10166* (2013.01); *H05K 2201/10416* (2013.01); *Y02B 70/1483* (2013.01)

(58) Field of Classification Search
    USPC ............ 361/748, 86; 257/76, 289, 676; 307/113; 322/23; 323/210; 327/108, 327/109
    See application file for complete search history.

(56) References Cited

U.S. PATENT DOCUMENTS

| | | |
|---|---|---|
| 2009/0002950 A1 | 1/2009 | Gertiser et al. |
| 2009/0051225 A1* | 2/2009 | Yang ................... H02M 3/1588 307/113 |
| 2009/0072368 A1* | 3/2009 | Hu .......................... H01L 24/41 257/676 |
| 2010/0085326 A1 | 4/2010 | Anno |
| 2010/0097105 A1* | 4/2010 | Morita ................ H01L 27/0605 327/109 |
| 2010/0109015 A1* | 5/2010 | Ueno .................... H01L 21/743 257/76 |
| 2011/0181250 A1* | 7/2011 | Urakabe ............... H02M 3/158 322/23 |
| 2012/0104408 A1* | 5/2012 | Imada ................ H01L 21/8252 257/76 |
| 2012/0139589 A1* | 6/2012 | Machida ........... H02M 3/33507 327/109 |
| 2012/0275076 A1* | 11/2012 | Shono ................... H01M 10/48 361/86 |
| 2013/0049814 A1 | 2/2013 | De Rooij et al. |
| 2013/0147523 A1* | 6/2013 | Deboy ................. H03K 17/166 327/108 |
| 2013/0240893 A1* | 9/2013 | Bedell .................... H01L 27/088 257/76 |
| 2013/0257304 A1* | 10/2013 | Takahashi ............. H02M 7/125 315/206 |
| 2014/0097701 A1* | 4/2014 | Bailey ................... H02M 7/538 307/113 |
| 2014/0210428 A1* | 7/2014 | Mauder ..................... G05F 1/70 323/210 |

FOREIGN PATENT DOCUMENTS

| | | |
|---|---|---|
| JP | 10270808 A | 10/1998 |
| JP | 2009095074 A | 4/2009 |
| JP | 2011142752 A | 7/2011 |
| JP | 2012210002 A | 10/2012 |
| WO | 2013029041 A2 | 2/2013 |

OTHER PUBLICATIONS

Written Opinion for application PCT/US2013/035743, dated Jan. 14, 2014, 8 pages.

EP Search Report for application EP 13881638.4, dated Feb. 14, 2017, 7 pgs.

* cited by examiner

ARCHITECTURE OF DRIVE UNIT EMPLOYING GALLIUM NITRIDE SWITCHES

FIELD OF INVENTION

The subject matter disclosed herein relates generally to the field of drive units, and more particularly, to a drive unit using gallium nitride switches.

DESCRIPTION OF RELATED ART

Existing elevator drive units are based on silicon insulated-gate bipolar transistors (IGBTs) and metal-oxide-semiconductor field-effect transistors (MOSFETs). The inherent switching characteristics of silicon based devices limit the practical maximum pulse width modulation (PWM) switching frequency, minimum loss, and minimum size of elevator drive units. Practical switching frequencies of silicon based devices are typically in the audible range and can lead to acoustic noise problems from the drive units and attached motors.

It is desirable to reduce the size of the elevator drive unit. Losses in existing, well designed drive units are on the order of 3-5%. These losses determine the size of heat sinks, and heat sink size is a major contributor to overall elevator drive unit size. Elevator drive unit size is also limited by inherent voltage blocking capability. Switching device size is another factor in overall drive unit size.

BRIEF SUMMARY

An exemplary embodiment includes a drive unit for driving a motor. The drive unit includes a printed circuit board; a first gallium nitride switch having a gate terminal, drain terminal and source terminal, the first gallium nitride switch mounted to the printed circuit board; a second gallium nitride switch having a gate terminal, drain terminal and source terminal, the second gallium nitride switch mounted to the printed circuit board; a gate driver generating a turn-off drive signal to turn off the first gallium nitride switch and turn off the second gallium nitride switch; a first turn-off trace on the printed circuit board, the first turn-off trace directing the turn-off drive signal to the gate terminal of the first gallium nitride switch; and a second turn-off trace on the printed circuit board, the second turn-off trace directing the turn-off drive signal to the gate terminal of the second gallium nitride switch; wherein an impedance of the first turn-off trace is substantially equal to an impedance of the second turn-off trace.

Another exemplary embodiment includes a drive unit for driving a motor. The drive unit includes a printed circuit board; a first gallium nitride switch mounted to a first side of the printed circuit board; a second gallium nitride switch mounted to the first side of the printed circuit board; and a heat sink mounted to a surface of the first gallium nitride switch and the second gallium nitride switch.

Another exemplary embodiment includes an elevator or escalator drive unit for driving a motor to impart motion to an elevator or escalator. The drive unit includes a printed circuit board; a first gallium nitride switch having a gate terminal, drain terminal and source terminal, the first gallium nitride switch mounted to the printed circuit board; a second gallium nitride switch having a gate terminal, drain terminal and source terminal, the second gallium nitride switch mounted to the printed circuit board; a gate driver generating a turn-off drive signal to turn off the first gallium nitride switch and turn off the second gallium nitride switch; a first turn-off trace on the printed circuit board, the first turn-off trace directing the turn-off drive signal to the gate terminal of the first gallium nitride switch; and a second turn-off trace on the printed circuit board, the second turn-off trace directing the turn-off drive signal to the gate terminal of the second gallium nitride switch; wherein an impedance of the first turn-off trace is substantially equal to an impedance of the second turn-off trace.

Another exemplary embodiment includes an elevator or escalator drive unit for driving a motor to impart motion to an elevator or escalator. The drive unit includes a printed circuit board; a first gallium nitride switch mounted to a first side of the printed circuit board; a second gallium nitride switch mounted to the first side of the printed circuit board; and a heat sink mounted to a surface of the first gallium nitride switch and the second gallium nitride switch.

Other aspects, features, and techniques of embodiments of the invention will become more apparent from the following description taken in conjunction with the drawings.

BRIEF DESCRIPTION OF THE DRAWINGS

Referring now to the drawings wherein like elements are numbered alike in the FIGURES.

DETAILED DESCRIPTION

Figure 1:
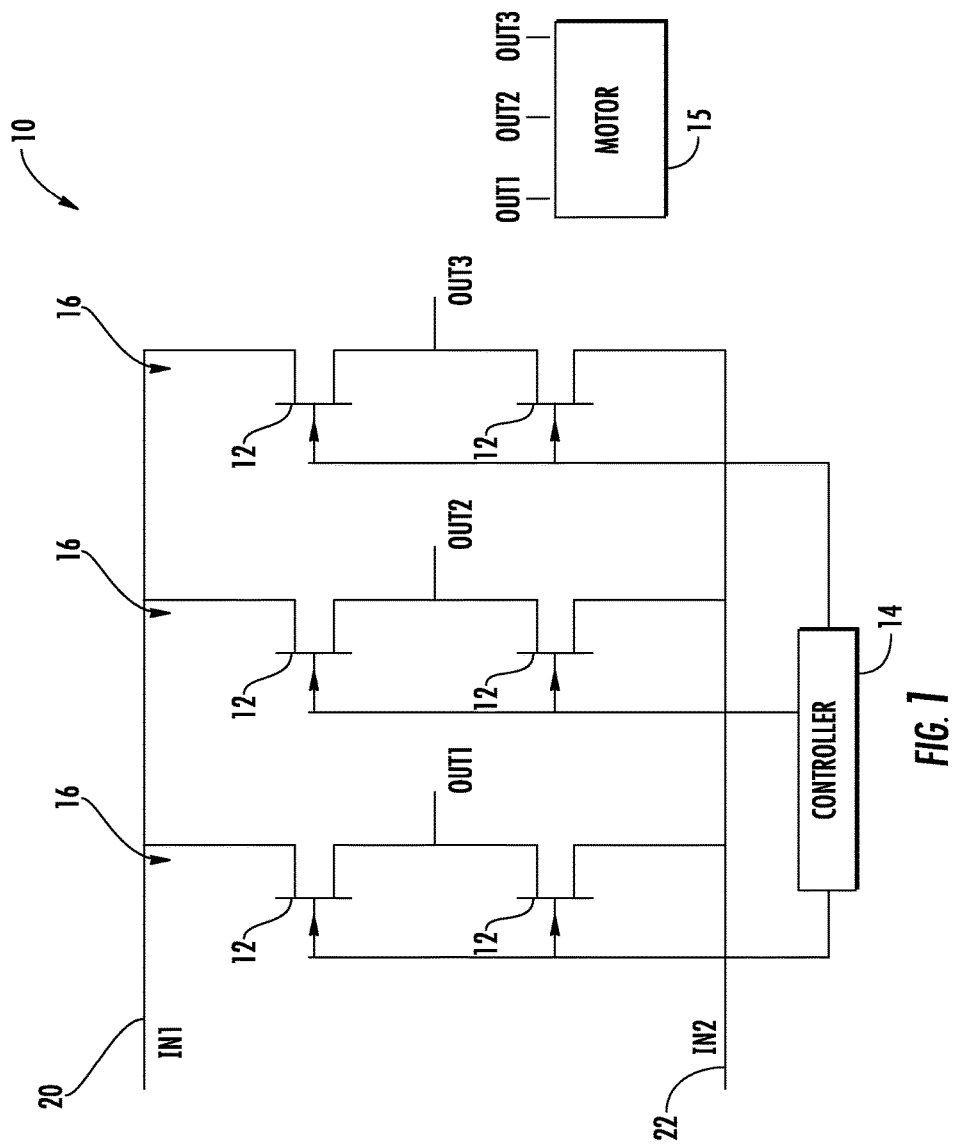
FIG. 1 is a schematic diagram of an elevator drive unit in an exemplary embodiment.

FIG. 1 is a schematic diagram of a drive unit 10 in an exemplary embodiment. Drive unit 10 may be employed as part of an elevator or escalator, in exemplary embodiments. Drive unit 10 includes a number of switching assemblies 12 driven by a controller 14. Controller 14 provides control signals to a gate driver 30 (FIG. 2) to control switches in the switching assemblies 12 as described herein. Control signals from controller 14 may be pulse width modulation (PWM) control signals in exemplary embodiments. Controller 14 may be implemented using a general-purpose microprocessor executing a computer program stored on a storage medium to perform the operations described herein. Alternatively, controller 14 may be implemented in hardware (e.g., ASIC, FPGA) or in a combination of hardware/software. Switching assemblies 12 may contain a plurality of switches, a gate driver and other components as described in further detail herein with reference to FIG. 2.

Drive unit 10 includes three phase legs 16, each phase leg 16 including two switching assemblies 12. Each phase leg 16 is connected to a first DC voltage bus 20 and a second DC voltage bus 22. In operation, controller 14 turns switching assemblies 12 on and off to apply either the first voltage from first DC voltage bus 20 or a second voltage from second DC voltage bus 22 to generate an AC signal at terminals OUT1, OUT 2 and OUT 3. In exemplary embodiments, terminals OUT 1, OUT 2 and OUT 3 are coupled to a motor 15, for example, a three phase elevator motor or escalator motor. Although three phase legs 16 are shown in FIG. 1, embodiments described herein may be used with any number of phases, including single phase drive units. FIG. 1 depicts a two level drive unit, but embodiments described herein may be used with any multilevel drive unit (e.g., three level neutral point clamped drive units). Drive unit 10 may operate as an inverter (DC to AC) in a drive mode or as a rectifier (AC to DC) in a regenerative mode.

Figure 2:
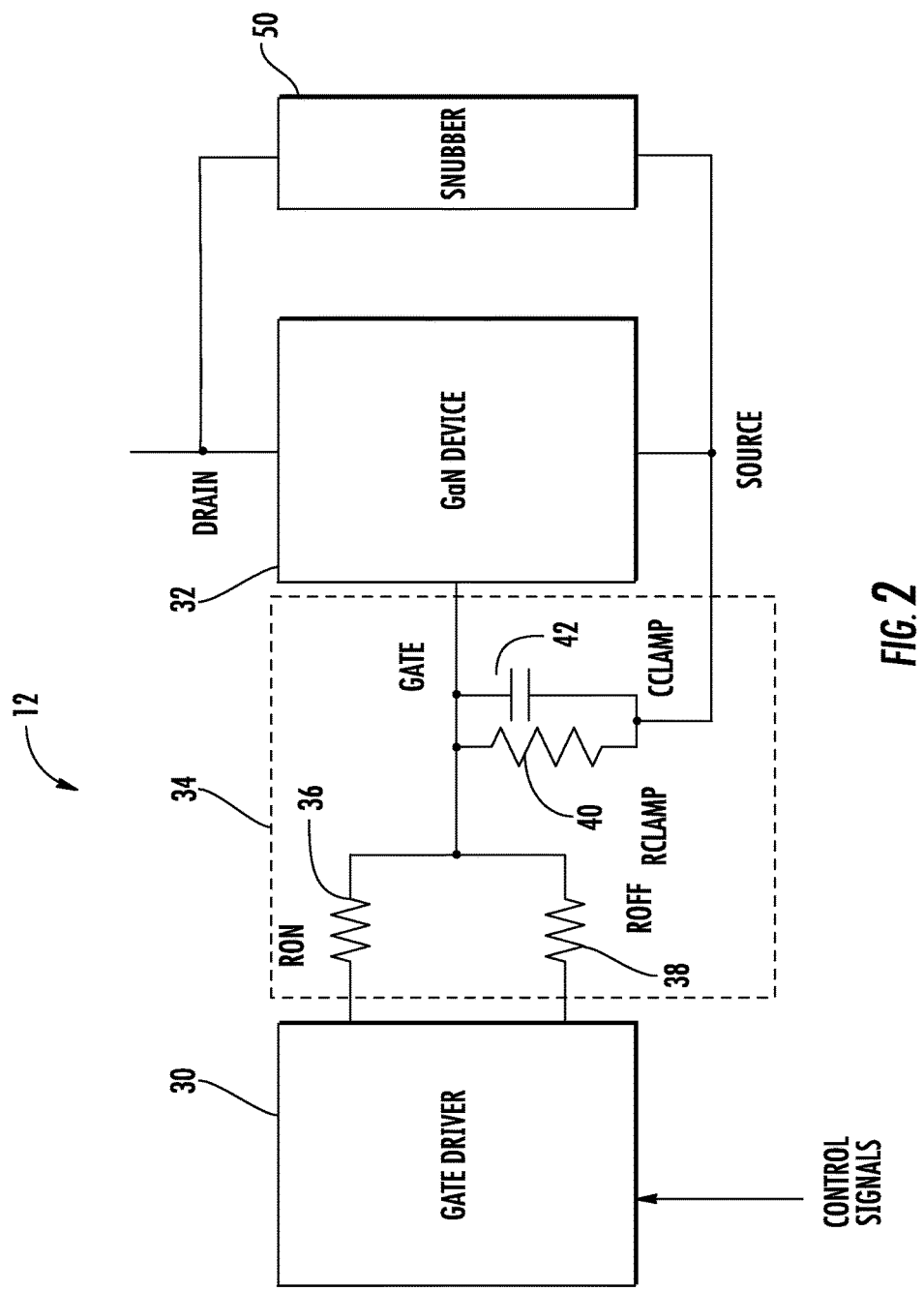
FIG. 2 depicts a switching assembly in an exemplary embodiment.

FIG. 2 depicts a switching assembly 12 in an exemplary embodiment. Switching assembly 12 includes a gate driver 30 that provides drive signals to a gate terminal of switch 32. Switch 32 is a gallium nitride transistor in an exemplary embodiment. Gate driver 30 receives control signals from controller 14 to generate drive signals for switch 32. Control signals from controller 14 may be pulse width modulation signals. A single switch 32 is shown in FIG. 2, but it is understood that switching assembly 12 may include a plurality of switches 32 driven by gate driver 30. Switches 32 in switching assembly 12 may be placed in parallel to increase current capacity.

Gallium nitride switches 32 are high speed switching devices and can be turned on and off in nanoseconds. Due to the fast switching, switches 32 can produce very high dv/dt which can significantly increase electromagnetic interference (EMI) and damage both the drive unit 10 and the driven component (e.g., motor 15). To manage the switching speed of switches 32, a gate drive circuit 34 is positioned between gate driver 30 and switch 32. The gate drive circuit 34 includes elements to control the switching speed of switch 32.

Gate drive circuit 34 includes a turn-on resistor 36 and a turn-off resistor 38, in series with the gate terminal of switch 32. When switch 32 is turned on, a turn-on drive signal is applied through turn-on resistor 36. When switch 32 is turned off, a turn-off drive signal is applied through turn-off resistor 38. In general, the turn-on resistor 36 may have a larger magnitude than turn-off resistor 38. Increasing the turn-on resistor 36 reduces overshoot of the gate terminal voltage.

Gate drive circuit 34 includes a gate clamping circuit including clamping resistor 40 and clamping capacitor 42. Clamping resistor 40 and clamping capacitor 42 are in parallel with each other, and connected across the gate terminal and source terminal of switch 32. By selecting the values of clamping resistor 40 and clamping capacitor 42, the switching speed of switch 32 can be controlled. This helps reduce dv/dt of switch 32.

Switching assembly 12 also includes a snubber circuit 50 coupled across the drain terminal and source terminal of switch 32. Snubber circuit 50 may be implemented using a resistor-capacitor circuit, a resistor-capacitor-diode circuit, or other known snubber circuit configurations. Snubber circuit 50 prevents voltage overshoot at the output of switch 32. By controlling the values of the turn-on resistor 36 and turn-off resistor 38, as well as the snubber circuit value, the turn-on time and turn-off time of switch 32 can be increased to reduce the voltage rise, and hence dv/dt, of switch 32. This enables a significant increase in life and reliability of drive units using gallium nitride devices.

Figure 3:
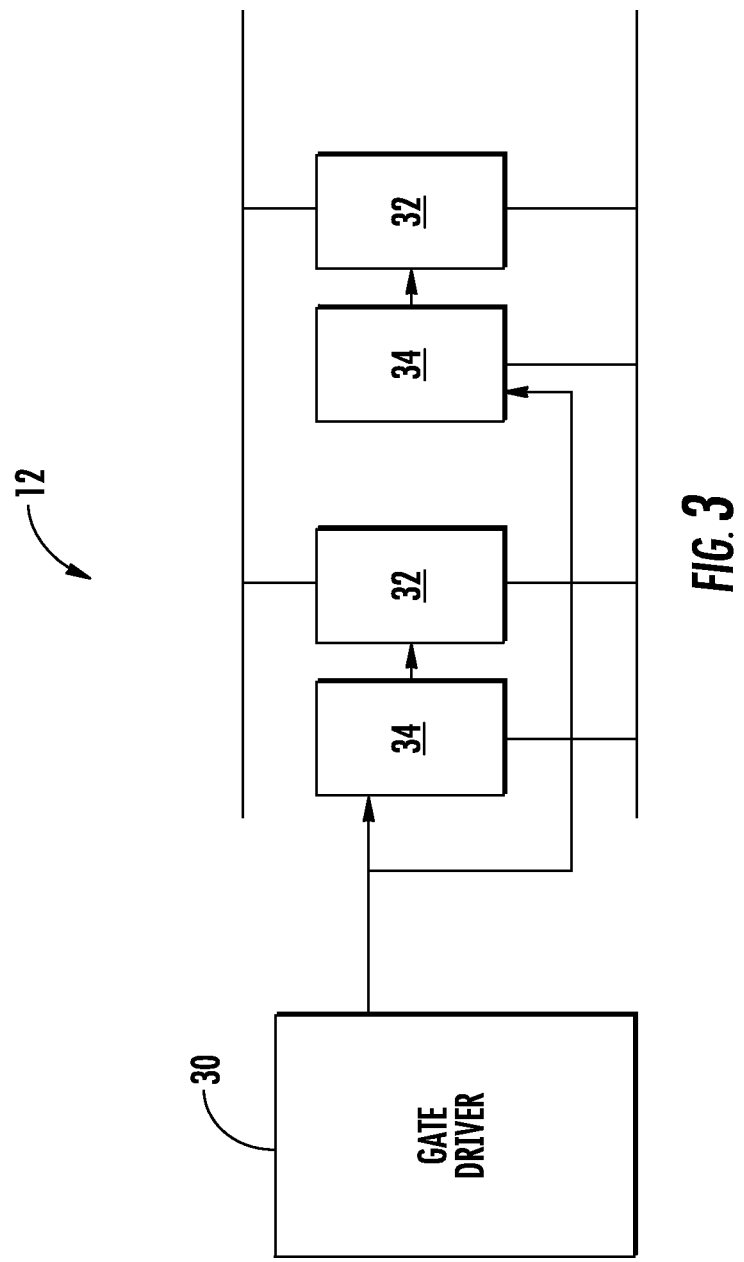
FIG. 3 depicts a switching assembly in another exemplary embodiment.

FIG. 3 depicts a switching assembly 12 having multiple switches 32. As shown, two switches 32 are in parallel, driven by a common gate driver 30. Snubber circuits 50 are not shown for ease of illustration. It is understood that more than two switches 32 may be placed in parallel and embodiments are not limited to two switches 32. Embodiments may include 8, 12, 16 or more switches in parallel. Each switch 32 includes a gate drive circuit 34 as discussed above. Arranging switches 32 in parallel increases current capability of the switching assembly 12. As noted above, switches 32 may also be arranged in series in alternate embodiments.

Figure 4:
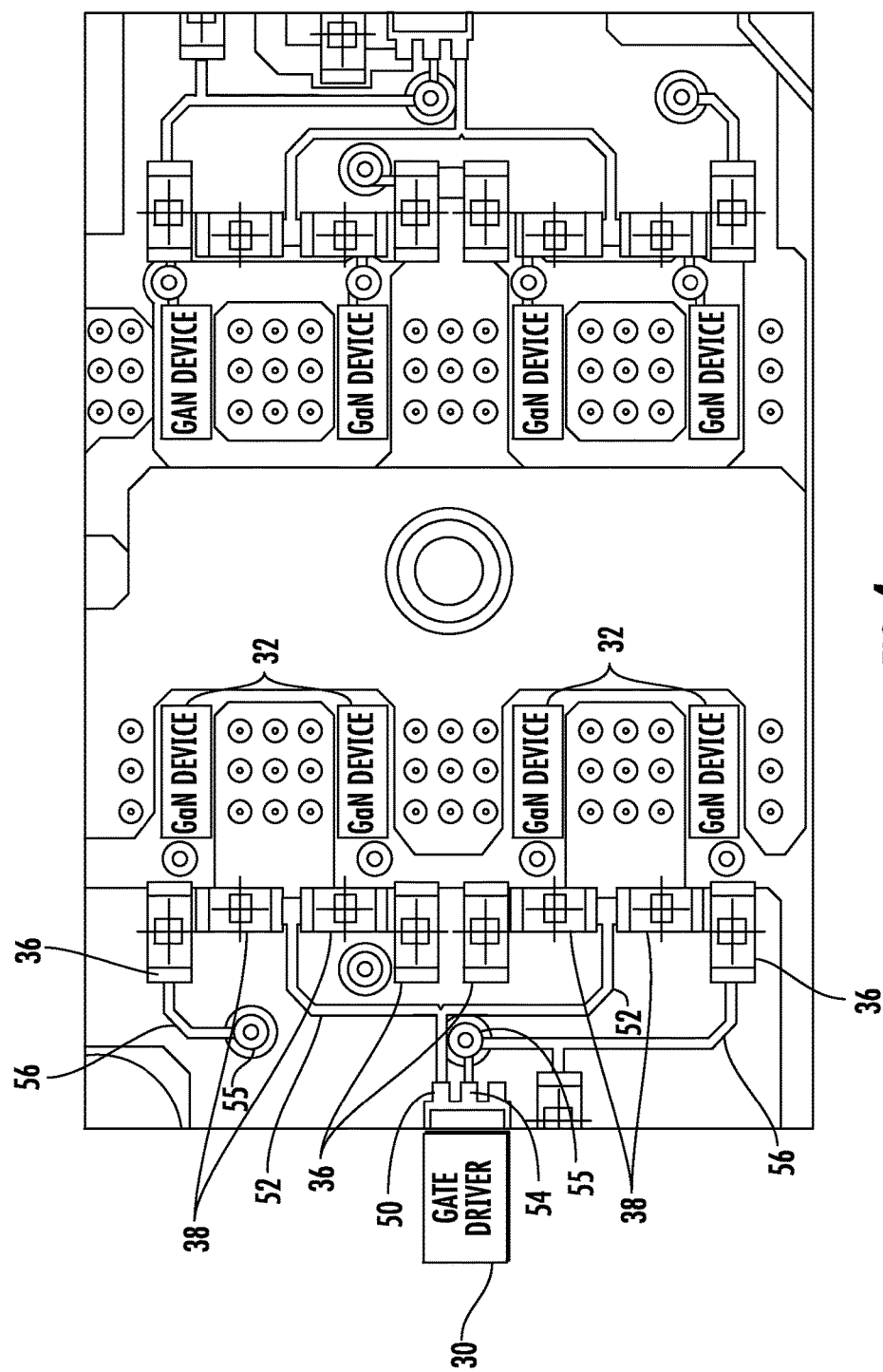
FIG. 4 depicts a drive unit printed circuit board in an exemplary embodiment.

FIG. 4 depicts a drive unit printed circuit board, for use with an elevator or escalator, in an exemplary embodiment. As noted above, a higher current rating for the drive unit 10 can be achieved by placing switches 32 in parallel. FIG. 4 depicts four switches 32 on a printed circuit board, where switches 32 are connected in electrical parallel. Also shown in FIG. 4 are four turn-off resistors 38, four turn-on resistors 36 and a gate driver 30. Each turn-off resistor 38 and each turn-on resistor 36 is associated with a respective switch 32. Gate driver 30 has a turn-off output terminal 50 coupled to the turn-off resistors 38 by turn-off traces 52. To turn switches 32 off, a turn-off drive signal is provided from turn-off output terminal 50, through turn-off traces 52, to turn-off resistors 38 and to the gate terminal of switches 32. Gate driver 30 has a turn-on output terminal 54 coupled to the turn-on resistors 36 by turn-on traces 56. To turn switches 32 on, a turn-on drive signal is provided from turn-on output terminal 54, through turn-on traces 56, to turn-on resistors 36 and to the gate terminal of switches 32.

It is desirable to turn on and turn off switches 32 in unison. Gallium nitride switches are high speed switching devices. In the presence of gate driver induced delays, the switching on time and off time can vary between multiple switches in parallel. This can result in oscillations between switches and ringing that can damage individual switches 32 and/or drive unit 10. To synchronize turning off switches 32 in parallel, the turn-off traces 52 between the turn-off output terminal 50 and the turn-off resistors 38 have substantially equal impedance. To synchronize turning on switches 32 in parallel, the turn-on traces 56 between the turn-on output terminal 54 and the turn-on resistors 36 have substantially equal impedance.

Achieving equal impedance across the turn-off traces 52 may be achieved by maintaining the same distance between the gate driver 30 and the turn-off resistors 38 for each switch 32. For example, as shown in FIG. 4, the input terminals of turn-off resistors 38 are equidistant from the gate driver 30. Further, vias (e.g., through holes from one side of the printed circuit board to the other) may be inserted along one or more turn-off traces 52 to equalize the impedance across the turn-off traces 52. Adding a via increases trace length, and thus increases trace impedance. Similar techniques may be employed to equalize the impedance across the turn-on traces 56. As shown in FIG. 4, vias 55 are used to alter the length of the turn-on traces 56, and thus alter the impedance. Equalizing the trace impedance between parallel switches 32 and gate driver 30 ensures that the gate drive signals received by the switches 32 are in synchronization, which prevents ringing between switches 32 during switching events. Equalizing the trace impedance between parallel switches 32 also enables better current sharing, which allows for a more even thermal distribution across switches 32.

Figure 5:
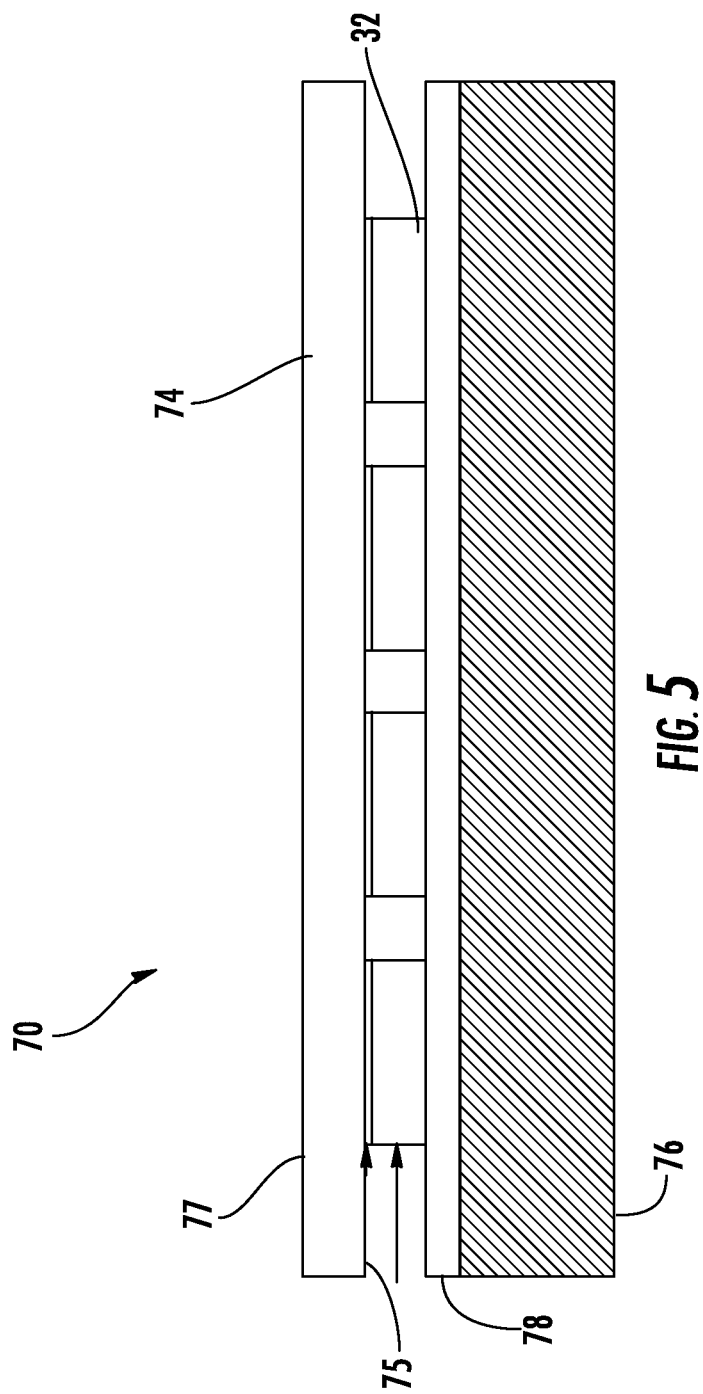
FIG. 5 is a side view of a drive unit printed circuit board in an exemplary embodiment.

Thermal management of the drive unit is addressed in exemplary embodiments. Gallium nitride switches have lower losses than equivalent silicon devices. Due to the small size of the gallium nitride devices, it is beneficial to remove the heat produced by these devices. FIG. 5 is a side view of a drive unit 70 having gallium nitride switches 32 mounted to a printed circuit board 74 in an exemplary embodiment. As shown in FIG. 5, all the switches 32 are mounted on a first side 75 of printed circuit board 74. The switches 32 may be solder mounted to printed circuit board 74 or other mounting techniques may be used (e.g., socket, BGA). Switches 32 are in thermal communication with a heat sink 76 through a soft, thermal interface material 78. Heat sink 76 may include heat pipes, liquid cooling loops, thermo electric coolers or plate fin channels.

No components taller than the gallium nitride switches 32 are mounted on the first side 75 of the printed circuit board 74. Control electronics and other components may be mounted on the second side 77 of the printed circuit board 74, opposite the first side 75. By placing all gallium nitride switches 32 on one side of the board, a single heat sink may be used to reduce overall cooling cost. A separate heat sink 76 may be used for each phase leg 16, or a single heat sink can be used for multiple phases (e.g., three phases as shown in FIG. 1). The configuration in FIG. 5 also provides for double-sided cooling of the drive unit by using one or more heat sinks on the second side 77 of printed circuit board 74.

Figure 6:
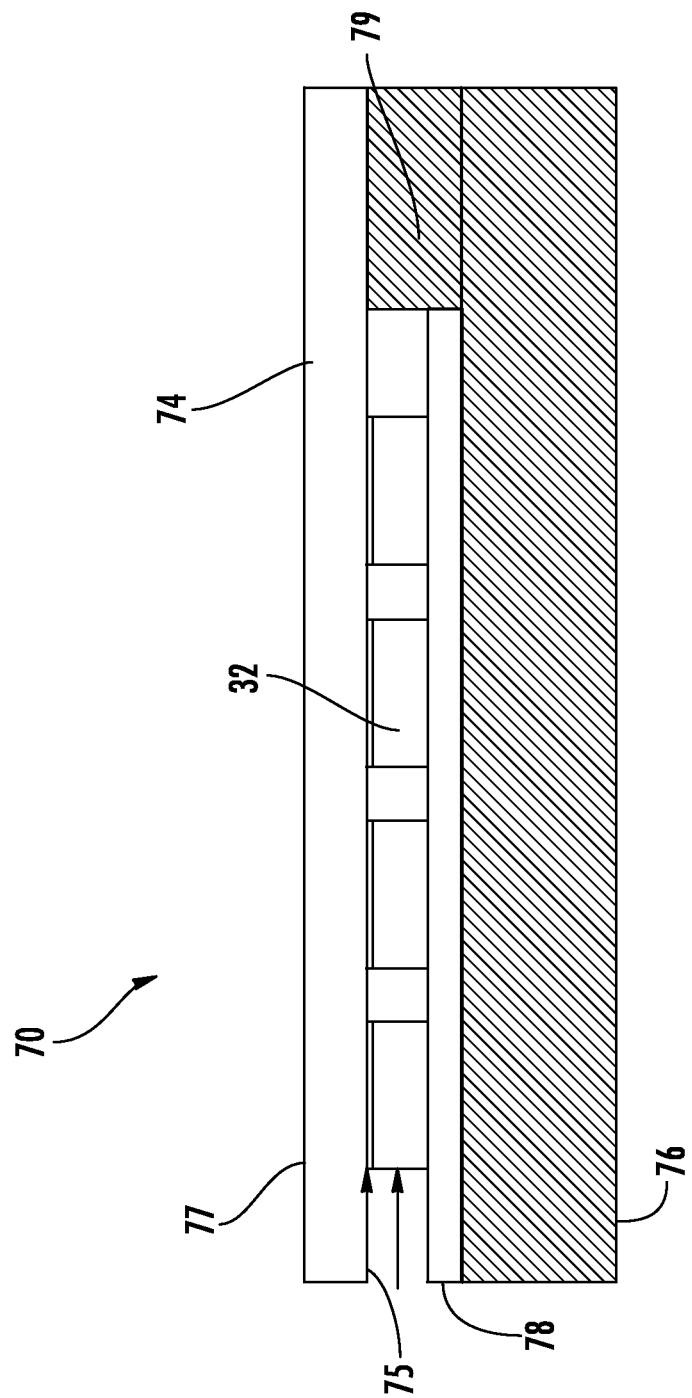
FIG. 6 is a side view of a drive unit printed circuit board in an exemplary embodiment.

FIG. 6 is a side view of drive unit 70 in an alternate exemplary embodiment. The embodiment of FIG. 6 is similar to that of FIG. 5, and similar reference numerals are used for similar elements. In FIG. 6, a power connection 79 is provided between heat sink 76 and printed circuit board 74. For example, terminals of switches 32 may be coupled to the power connection 79 through traces on printed circuit board 74. This allows heat sink 76 to also be used as a power connection, drawing power from the drive unit 70.

Figure 8:
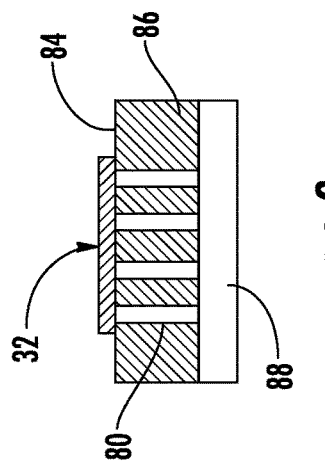
FIG. 8 is a cross-sectional view of a portion of a drive unit printed circuit board in an exemplary embodiment.
Figure 7:
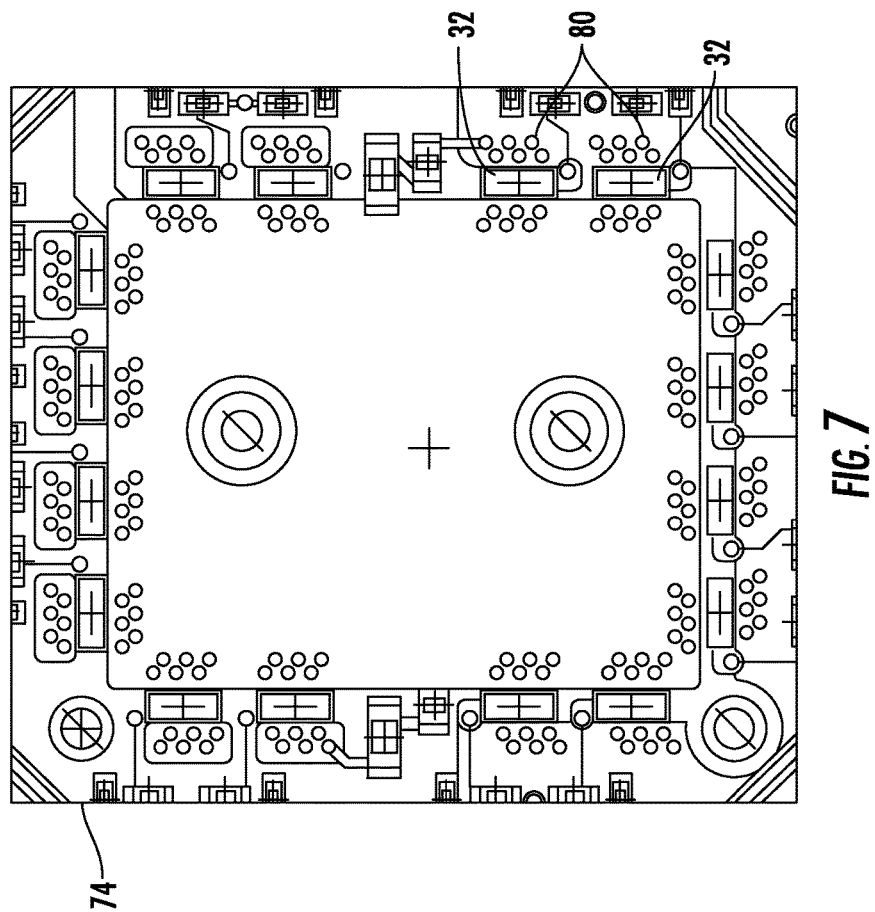
FIG. 7 depicts a drive unit printed circuit board in an exemplary embodiment.

FIG. 7 depicts a drive unit printed circuit board 74 in an exemplary embodiment. The embodiment of FIG. 7 includes additional thermal management elements. Gallium nitride switches 32 are mounted to printed circuit board 74 as described above. Thermal vias 80 (e.g., copper through holes) are provided in the printed circuit board 74 adjacent switches 32. As shown in FIG. 8, the thermal vias 80 connect a metal layer 84 (e.g., copper), on which switch 32 is mounted, to other thermal layers 86 (e.g., copper) embedded in the printed circuit board 74. Thermal layers 86 may be copper heat spreaders embedded within the printed circuit board 74. Thermal vias 80 may also be in thermal communication with a heat sink 88 on an opposite side of the printed circuit board 74. Thermal vias 80 enable the conduction of heat from switches 32 and decrease the thermal resistance of the drive unit. Thermal vias 80 can either be hollow or filled with a thermally conducting material such as solder or copper.

A drive unit using gallium nitride switches has many advantages over those based on silicon devices. The inherent switching characteristics of gallium nitride devices versus silicon devices raises the practical maximum PWM switching frequency, reduces minimum loss, and reduces minimum size of drive units, such as elevator drive units. Practical switching frequencies well above the audible range are possible using gallium nitride devices, which eliminates acoustic noise problems from the drive units and attached motors. Losses in a gallium nitride drive unit can be on the order of 1-2%. These reduced losses reduce the required size and/or number of heat sinks, and heat sink size is an important contributor to overall elevator drive unit size. Elevator drive design depends on voltage rating of available device and device arrangements needs to be used to realize appropriate drive voltage. Small, efficient drive units provide increased flexibility in drive unit location, simplifying installation and servicing.

The terminology used herein is for the purpose of describing particular embodiments only and is not intended to be limiting of the invention. While the description of the present invention has been presented for purposes of illustration and description, it is not intended to be exhaustive or limited to the invention in the form disclosed. Many modifications, variations, alterations, substitutions, or equivalent arrangement not hereto described will be apparent to those of ordinary skill in the art without departing from the scope and spirit of the invention. Additionally, while the various embodiments of the invention have been described, it is to be understood that aspects of the invention may include only some of the described embodiments. Accordingly, the invention is not to be seen as being limited by the foregoing description, but is only limited by the scope of the appended claims.

The invention claimed is:

1. A drive unit for driving a motor, the drive unit comprising:
   a printed circuit board;
   a first gallium nitride switch having a gate terminal, drain terminal and source terminal, the first gallium nitride switch mounted to the printed circuit board;
   a second gallium nitride switch having a gate terminal, drain terminal and source terminal, the second gallium nitride switch mounted to the printed circuit board;
   a gate driver generating a turn-off drive signal to turn off the first gallium nitride switch and turn off the second gallium nitride switch;
   a first turn-off trace on the printed circuit board, the first turn-off trace directing the turn-off drive signal to the gate terminal of the first gallium nitride switch; and
   a second turn-off trace on the printed circuit board, the second turn-off trace directing the turn-off drive signal to the gate terminal of the second gallium nitride switch;
   wherein an impedance of the first turn-off trace is substantially equal to an impedance of the second turn-off trace;
   a first turn-on trace on the printed circuit board, the first turn-on trace directing the turn-on drive signal to the gate terminal of the first gallium nitride switch;
   a second turn-on trace on the printed circuit board, the second turn-on trace directing the turn-on drive signal to the gate terminal of the second gallium nitride switch;
   wherein an impedance of the first turn-on trace is substantially equal to an impedance of the second turn-on trace;
   wherein the gate driver generates a turn-on drive signal to turn on the first gallium nitride switch and turn on the second gallium nitride switch;
   a via positioned in one of the first turn-off trace and the second turn-off trace, the via extending through the printed circuit board to render the impedance of the first turn-off trace substantially equal to the impedance of the second turn-off trace.

2. The drive unit of claim 1 further comprising:
   a via positioned in one of the first turn-on trace and the second turn-on trace, the via positioned to render the impedance of the first turn-on trace substantially equal to the impedance of the second turn-on trace.

3. The drive unit of claim 1 wherein:
   the first gallium nitride switch and the second gallium nitride switch are in electrical parallel.

4. A drive unit for driving a motor, the drive unit comprising:
a printed circuit board;
a first gallium nitride switch having a gate terminal, drain terminal and source terminal, the first gallium nitride switch mounted to the printed circuit board;
a second gallium nitride switch having a gate terminal, drain terminal and source terminal, the second gallium nitride switch mounted to the printed circuit board;
a gate driver generating a turn-off drive signal to turn off the first gallium nitride switch and turn off the second gallium nitride switch;
a first turn-off trace on the printed circuit board, the first turn-off trace directing the turn-off drive signal to the gate terminal of the first gallium nitride switch; and
a second turn-off trace on the printed circuit board, the second turn-off trace directing the turn-off drive signal to the gate terminal of the second gallium nitride switch;
wherein an impedance of the first turn-off trace is substantially equal to an impedance of the second turn-off trace;
a first turn-on trace on the printed circuit board, the first turn-on trace directing the turn-on drive signal to the gate terminal of the first gallium nitride switch;
a second turn-on trace on the printed circuit board, the second turn-on trace directing the turn-on drive signal to the gate terminal of the second gallium nitride switch;
wherein an impedance of the first turn-on trace is substantially equal to an impedance of the second turn-on trace;
wherein the gate driver generates a turn-on drive signal to turn on the first gallium nitride switch and turn on the second gallium nitride switch;
a via positioned in one of the first turn-off trace and the second turn-off trace, the via extending through the printed circuit board to render the impedance of the first turn-off trace substantially equal to the impedance of the second turn-off trace;
a heat sink mounted to a surface of the first gallium nitride switch and the second gallium nitride switch.

5. The drive unit of claim 4 wherein:
the first gallium nitride switch and second gallium nitride switch are part of a common phase leg of the drive unit.

6. The drive unit of claim 4 wherein:
the first gallium nitride switch and second gallium nitride switch are part of different phases legs of the drive unit.

7. The drive unit of claim 4 wherein:
no components taller than the first gallium nitride switch and the second gallium nitride switch are mounted on the first side of the printed circuit board.

8. The drive unit of claim 4 further comprising:
a power connection electrically connecting the heat sink to a trace on the printed circuit board.

9. The drive unit of claim 4 further comprising:
at least one thermal via positioned adjacent the first gallium nitride switch, the thermal via extending into the printed circuit board away from the first side of the printed circuit board.

10. The drive unit of claim 9 further comprising:
a thermal layer embedded in the printed circuit board, the thermal layer in thermal communication with the thermal via.

11. The drive unit of claim 9 wherein:
the thermal via extends through the printed circuit board to a second side of the printed circuit board.

12. The drive unit of claim 11 further comprising:
a heat sink on the second side of the printed circuit board, the heat sink in thermal communication with the thermal via.

* * * * *